(12) United States Patent
Crisp et al.

(10) Patent No.: US 9,123,713 B2
(45) Date of Patent: Sep. 1, 2015

(54) LEAD STRUCTURES WITH VERTICAL OFFSETS

(75) Inventors: Richard Dewitt Crisp, Hornitos, CA (US); Belgacem Haba, Saratoga, CA (US); Wael Zohni, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 279 days.

(21) Appl. No.: 13/989,314

(22) PCT Filed: Nov. 21, 2011

(86) PCT No.: PCT/US2011/061647
§ 371 (c)(1),
(2), (4) Date: Jul. 23, 2013

(87) PCT Pub. No.: WO2012/071325
PCT Pub. Date: May 31, 2012

(65) Prior Publication Data
US 2013/0299958 A1    Nov. 14, 2013

Related U.S. Application Data

(60) Provisional application No. 61/416,779, filed on Nov. 24, 2010.

(51) Int. Cl.
*H01L 23/495* (2006.01)
*H01L 23/13* (2006.01)
*H01L 23/00* (2006.01)

(52) U.S. Cl.
CPC .......... *H01L 23/49575* (2013.01); *H01L 23/13* (2013.01); *H01L 24/48* (2013.01); *H01L 24/49* (2013.01); *H01L 24/06* (2013.01); *H01L 2224/06136* (2013.01);
(Continued)

(58) Field of Classification Search
IPC .... H01L 2224/48227,2224/32145, 2224/48091, H01L 2224/48247, 2224/85205, 2924/014, H01L 2924/01079
See application file for complete search history.

(56) References Cited

U.S. PATENT DOCUMENTS 5,243,497 A * 9/1993 Chiu .............................. 361/783
5,468,999 A   11/1995 Lin et al.
(Continued)

FOREIGN PATENT DOCUMENTS

JP      6302638 A    10/1994
JP      06326160 A   11/1994
(Continued)

OTHER PUBLICATIONS

International Search Report and Written Opinion for Application No. PCT/US2011/61647 dated May 10, 2012.
(Continued)

*Primary Examiner* — Roy Potter
(74) *Attorney, Agent, or Firm* — Lerner, David, Littenberg, Krumholz & Mentlik, LLP (57) ABSTRACT

A microelectronic structure includes a first row of contacts (14) and a second row of contacts (24) offset from the first row, so that the first and second rows cooperatively define pairs of contacts. These pairs of contacts include first pairs (30a) and second pairs (30b) arranged in alternating sequence in the row direction. The first pairs are provided with low connectors (32a), whereas the second pairs are provided with high connectors (32b). The high connectors and low connectors have sections vertically offset from one another to reduce mutual impedance between adjacent connectors.

29 Claims, 4 Drawing Sheets (52) U.S. Cl.
CPC ............... *H01L 2224/45015* (2013.01); *H01L 2224/4809* (2013.01); *H01L 2224/4824* (2013.01); *H01L 2224/48091* (2013.01); *H01L 2224/48095* (2013.01); *H01L 2224/48465* (2013.01); *H01L 2224/49052* (2013.01); *H01L 2224/49111* (2013.01); *H01L 2224/49175* (2013.01); *H01L 2224/49176* (2013.01); *H01L 2924/01005* (2013.01); *H01L 2924/01006* (2013.01); *H01L 2924/01033* (2013.01); *H01L 2924/01082* (2013.01); *H01L 2924/1432* (2013.01); *H01L 2924/1433* (2013.01); *H01L 2924/1434* (2013.01); *H01L 2924/20751* (2013.01); *H01L 2924/3011* (2013.01); *H01L 2924/30107* (2013.01)

(56) References Cited

U.S. PATENT DOCUMENTS

| | | | |
|---|---|---|---|
| 6,476,506 | B1 | 11/2002 | O'Connor et al. |
| 6,812,580 | B1 | 11/2004 | Wenzel et al. |
| 7,456,505 | B2 | 11/2008 | Gospodinova et al. |
| 7,466,021 | B2 | 12/2008 | Fjelstad |
| 7,528,011 | B2 | 5/2009 | Yano et al. |
| 7,675,168 | B2 | 3/2010 | Appel et al. |
| 7,777,353 | B2 | 8/2010 | Ohkawa |
| 2006/0081972 | A1* | 4/2006 | Katagiri et al. ............... 257/690 |
| 2006/0131742 | A1 | 6/2006 | Tzu |
| 2007/0007669 | A1 | 1/2007 | Hsu et al. |
| 2007/0105272 | A1 | 5/2007 | Lee et al. |
| 2008/0088012 | A1 | 4/2008 | Ohkawa |
| 2010/0120198 | A1 | 5/2010 | Appel et al. |
| 2010/0232128 | A1 | 9/2010 | Haba et al. |

FOREIGN PATENT DOCUMENTS

| | | |
|---|---|---|
| JP | 1995-050314 | 2/1995 |
| JP | 2000332160 A | 11/2000 |
| JP | 2005-064248 | 3/2005 |
| JP | 2005-311159 | 11/2005 |
| JP | 2009-124075 A | 6/2009 |
| KR | 100950511 B1 | 3/2010 |
| TW | 200715492 | 4/2007 |

OTHER PUBLICATIONS

Taiwanese Office Action for Application No. 100143203 dated Sep. 9, 2014.

* cited by examiner

LEAD STRUCTURES WITH VERTICAL OFFSETS

CROSS-REFERENCE TO RELATED APPLICATION

The present application is a national phase entry under 35 U.S.C. §371 of International Application No. PCT/US2011/061647 filed Nov. 21, 2011, published in English, which claims the benefit of the filing date of U.S. Provisional Patent Application No. 61/416,779, filed Nov. 24, 2010. The disclosure of the foregoing are hereby incorporated herein by reference.

FIELD OF THE INVENTION

The present invention relates to microelectronic structures, leads for the same, and methods of forming microelectronic structures.

BACKGROUND OF THE INVENTION

Many microelectronic structures are made with rows of contacts interconnected with one another by leads such as wire bonds. For example, a microelectronic element such as a semiconductor chip may be made with one or more rows of contacts exposed at a front surface of the chip. Each row of contacts extends in a direction referred to herein as the "row direction." A package substrate may overlie the front surface of the chip. The package substrate may incorporate rows of contacts, commonly referred to as "bond pads" corresponding to the rows of contacts on the chip. Typically, each row of contacts on the package substrate extends parallel to a row of contacts on the chip. The package substrate may include other electrically conductive elements such as terminals for connecting the substrate to an external element, such as a circuit board, and traces connecting the terminals to the contacts or bond pads. The contacts or bond pads of the package substrate are connected to contacts of the chip by leads such as wire bonds. For example, the package substrate may incorporate an elongated slot and one or more rows of contacts extending in a row direction along the slot. The package substrate may be placed on the front surface of the chip so that the slot is aligned with a row of contacts on the chip. The wire bonds extend from the contacts of the package substrate into the slot to the contacts of the chip.

In other cases, a package substrate may have a row of contacts disposed along an edge of the substrate, so that the leads extend from the contacts of the package substrate, over the edge of the package substrate, and downwardly to the contacts of the chip. In still other arrangements, the chip is disposed with a rear surface facing toward the package substrate and with the front, contact-bearing surface facing upwardly away from the package substrate. In this case, the leads may extend over an edge of the chip to the contacts on the package substrate.

Inductances in the leads can pose significant issues. For example, where the contacts of the chip are disposed at small intervals at the row direction the leads are also disposed at relatively small intervals in the row direction. Because the leads lie relatively close to one another, there can be substantial mutual inductance between adjacent leads. Where adjacent leads carry different currents, potentials or signals, there can be cross-talk between the leads. For example, where one lead is carrying a rapidly changing current, the mutual inductance with the adjacent lead will cause a rapidly changing voltage to appear on the adjacent lead. This rapidly changing voltage effectively constitutes "noise" or unwanted voltage fluctuations on the adjacent lead and impairs signal transmissions on the adjacent lead.

Moreover, the mutual inductance between the leads increases the effective inductance along each lead, i.e., the inductance appearing between the contact of the chip and the contact of the package substrate which are connected to one another by a particular lead. This increased effective inductance reduces the speed with which signals can be conveyed along the leads. These problems have become more significant as the speed of operation of components such as semiconductor chips has increased, and the frequency of signals sent along the leads has also increased.

Certain aspects of the present invention alleviate or mitigate these problems.

BRIEF SUMMARY OF THE INVENTION

One aspect of the invention provides microelectronic structures. A microelectronic structure according to this aspect of the invention desirably includes a first element having a first row of contacts extending in a row direction in a first plane, and a second element having a second row of contacts extending parallel to the first row of contacts. The second row of contacts may be offset from the first row in a horizontal direction transverse to the row direction and offset upwardly in the vertical direction from the first row of contacts. The first-row and second row contacts define single-connection pairs each including a first-row contact and a second-row contact, the single-connection pairs including mutually adjacent first and second pairs arranged in alternating sequence in the row direction.

The structure according to this aspect of the invention desirably also includes elongated connectors, one of connectors extending between the first-row contact and the second-row contact of each of the single-connection pairs. Desirably, the connectors associated with the first pairs are low connectors, whereas the connectors associated with the second pairs are high connectors. In a structure according to this aspect of the invention, each high connector desirably extends generally upwardly from a first-row contact at a horizontal location adjacent the first row, whereas each low connector extends generally horizontally from a first-row contact and extends generally upwardly at a horizontal location remote from the first row. With this arrangement, sections of the high connectors are offset vertically from sections of the low connectors.

As further discussed below, the vertical offset between sections of mutually-adjacent connectors provide increased distances between the adjacent connectors and reduced mutual inductance between adjacent connectors.

A microelectronic structure according to a further aspect of the invention desirably includes a semiconductor chip having a first row of contacts exposed at a front surface of the chip, such row extending in a row direction. The structure desirably further includes a package substrate overlying the front surface of the chip, the package substrate having an upwardly facing surface and a second row of contacts exposed at the upwardly facing surface extending parallel to the first row of contacts. The second row of contacts desirably is spaced apart from the first row in a horizontal direction transverse to the row direction and is offset upwardly in the vertical direction from the first row of contacts. The first-row and second row contacts define single-connection pairs each including a first-row contact and a second-row contact. The single-connection pairs desirably include mutually adjacent first and second pairs arranged in alternating sequence in the row direction.

The structure desirably includes an elongated connectors extending between the first-row contact and the second-row contact of each of the single-connection pairs, the connectors associated with the first pairs being low connectors, the connectors associated with the second pairs being high connectors. In a structure according to this aspect of the invention, the high connectors desirably have at least about 30% of their length disposed above the second contacts, whereas the low connectors having at least about 30% of their length disposed below the second contacts. In certain embodiments a structure according to this aspect of the invention provide reduced mutual inductance without appreciably increasing the height of the structure.

Yet another aspect of the invention provides further microelectronic structures. A structure according to this aspect of the invention desirably includes a semiconductor chip having a first row of contacts exposed at a front surface of the chip extending in a row direction. The structure preferably also includes a package substrate having a slot extending through it, the package substrate overlying the front surface of the chip so that the first contacts of the chip are disposed in alignment with the slot. The package substrate preferably has an upwardly facing surface and a second row of contacts exposed at the upwardly facing surface, the second row of contacts extending parallel to the first row of contacts. Here again, the second row of contacts desirably is spaced apart from the first row in a horizontal direction transverse to the row direction and is offset upwardly in the vertical direction from the first row of contacts. Here again, the first-row and second-row contacts define single-connection pairs each including a first-row contact and a second-row contact. The single-connection pairs desirably include mutually adjacent first and second pairs arranged in alternating sequence in the row direction.

The structure according to this aspect of the invention preferably includes an elongated connector extending between the first-row contact and the second-row contact of each of the single-connection pairs. The connectors associated with the first pairs desirably are low connectors, whereas the connectors associated with the second pairs desirably are high connectors. The high connectors desirably are offset upwardly in the vertical direction from the low connectors over at least a portion of the lengths of the connectors. In a structure according to this aspect of the invention, each of the high and low connectors includes at least one wire bond, and each of the wire bonds of the connectors having a ball bond at a first contact. Thus, ball bonds are provided within the slot of the substrate. The ball bonds can be attached even within the narrow confines of the slot. The wire bonds may be provided with other types of bonds, such as wedge bonds, at the second contacts.

DETAILED DESCRIPTION

Figure 1:
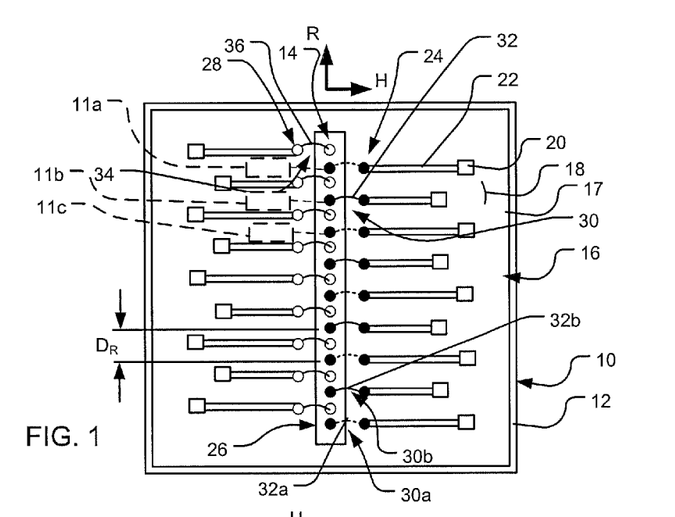
FIG. 1 is a diagrammatic top plan view of a structure according to one embodiment of the invention.
Figure 2:
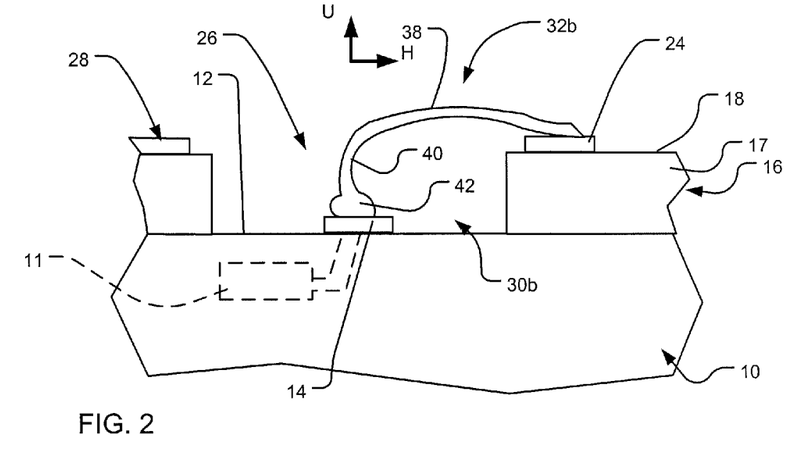
FIG. 2 is a fragmentary, diagrammatic sectional view of the structure depicted in FIG. 1.

A structure in accordance with one embodiment of the invention includes a first element 10 in a form of a semiconductor chip having a front surface 12 facing toward the viewer in FIG. 1. The first element or chip 10 defines a first row of contacts 14 extending in a row direction R. The front surface 12 of the chip is generally planar, and contacts 14 are disposed in a first plane parallel to the plane of the front surface. For example, the contacts may be coplanar with the front surface, recessed from the front surface, or standing proud of the front surface 12. Chip 10 includes numerous internal circuits 11, only a few of which are depicted in FIGS. 1 and 2. Each contact 14 is connected to one or more of the internal circuits. Many or all of the contacts 14 are connected to different ones of the internal circuits 11. For example, one contact 14 is connected to internal circuit 11a (FIG. 1), another contact 14 is connected to internal circuit 11b and yet another contact 14 is connected to internal circuit 11c. Typically, the different contacts 14 carry different signals to or from the internal circuits. The particular arrangement of contacts and internal circuits will vary with the function of the chip. Merely by way of example, where chip 10 is a memory chip, the different contacts 14 may carry different signals such as data signals and address signals, whereas other contacts 14 may carry power or ground potentials. In another example, where chip 10 is a processor or ASIC, different contacts 14 may carry different elements of a parallel I/O transmission line or other signals.

The structure also includes a second element 16 in the form of a package substrate. Package substrate 16 includes a dielectric structure 17 (FIG. 2), which may include one or more layers of dielectric material. The dielectric structure 17 defines a top surface 18 facing in upward direction, toward the viewer in FIG. 1. The upward direction is indicated by an arrow U in FIG. 2. The "upward direction" is defined in the frame of reference of the components themselves and has no particular relation to the normal gravitation frame of reference. Thus, the upward direction should be taken as the direction pointing out of chip 10 at surface 12 and normal to surface 12. As used herein, the term "vertical" refers to the upward direction and the opposite, downward direction.

The second element or package substrate 16 defines terminals 20 exposed at the top surface 18 of the dielectric structure 17 and traces 22 extending from the terminals 20. The second element also defines an elongated slot 26 extending in the row direction R. Slot 26 extends through the thickness of dielectric structure 17 and is aligned with the first row of contacts 14 so that contacts 14 are disposed within the slot. The second element or package substrate 16 also defines a second row of contacts 24 extending in the row direction R on one side of slot 26 and a third row of contacts 28 extending in the row direction on the opposite side of the slot from second row 24. Thus, the contacts 24 of the second row are offset from the contacts 14 of the first row in a horizontal direction H transverse to the row direction, whereas the contacts 28 of the third row are offset from contacts 14 of the first row in the opposite horizontal direction.

As best appreciated with reference to FIG. 2, the contacts 24 and 28 of the second and third rows are also offset upwardly, in direction U, from the contacts 14 of the first row. In the embodiment of FIG. 1, all of the contacts each row lie at the same location in the horizontal direction H and at the same location in the vertical direction, but are offset from one another in the row direction R. For example, all of the contacts 14 of the first row are disposed at the same locations in the horizontal and vertical directions, whereas all of the contacts 24 of the second row lie at the same location in the horizontal and vertical directions. In this embodiment, each row of contacts is straight.

The contacts 14 of the first row are more numerous than the contacts 24 of the second row. Some of the contacts 14 in the first row and some or all of the contacts 24 in the second row form pairs 30 of contacts. Each pair 30 includes one contact 14 of the first row and one contact 24 of the second row. The contacts included in pairs 30 are indicated as dark circles in FIG. 1. A lead in the form of a wire bond 32, shown schematically as an arc in FIG. 1, is provided for each pair 30. Some or all of the first-row contacts 14 on chip 10, which are not included in the pairs 30 with contacts 24 of the first row, form additional pairs 34 with contacts 28 of the third row. The contacts 14 and 28 included in these pairs 34 are shown as light circles in FIG. 1. Leads 36 are also provided for each pair 34 of first and third row contacts.

The pairs 30 defined by the first row and second row contacts 14 and 24 include first pairs 30a and second pairs 30b. The lead 32 of each first pair 30a is a "low lead" 32a, schematically indicated as a dashed arc in FIG. 1, whereas the lead 32 associated with each second pair 30b is "high lead" 32b, schematically indicated as a solid arc in FIG. 1. Pairs 30a and 30b are arranged in alternating sequence in the row direction. Thus, the pairs neighboring each first pair 30a are second pairs 30b and vice versa. These pairs are interspersed with the pairs 34 of first and third row contacts.

As best seen in FIG. 2, a fragmentary sectional view looking in the row direction R, each high lead 32b associated with a second pair 30b includes a main section 38 which extends generally horizontally at or above the vertical level of the second contact 24 incorporated in the associated second contact pair 30b. The main section 38 is connected at one end to the second contact 24. The opposite end of the main section 38, merges with a generally vertically extending leg 40 which extends generally downwardly from the main section 38 to an end 39 adjacent the first contact 14. Stated another way, leg 40 extends generally upwardly, at a horizontal location adjacent the first row of contacts 14, from end 39 to main section 38. End 39 is connected via a ball bond 42 to the first contact 14, so that the ball bond 42 is disposed within slot 26. As used in this disclosure, the term "generally horizontally" means that the main section 38 is within about 45° of exactly horizontal. More preferably, the main section 38 is within about 25° of exactly horizontal over most of all of its length. Likewise, the terms "generally vertical," "generally upwardly," and "generally downwardly" as applied to the leg 40 means that the leg deviates from the exactly vertical direction (the upward direction U in FIG. 2) by less than about 45°. More preferably, the leg 40 lies within about 25° of exactly vertical. The high leads 32b in this embodiment are fabricated by a wire-bonding process. The wire-bonding process begins by attaching a ball previously formed on the end of a very fine wire to the first contact 14 and forms the contour of the lead by paying out the fine wire from a bonding head as the bonding head traverses a path which will form the desired shape, including the leg 40 and main section 38. In the embodiment shown, the end of main section 38 opposite from the ball bond 42 is bonded to second contact by a wedge bond, which does not involve a ball. The general processes of wire-bonding are well known in the art and need not be described in full herein. However, wedge bonding typically involves substantial motion of the bonding head in the horizontal direction, whereas ball bonding does not. Where a ball bond and a wedge bond are used at opposite ends of the lead, it is advantageous to place the ball bond within the slot 26 and thus on first contacts 14, and to place the wedge bond on the second contacts 24 outside of the slot. This assures that the bonding head has adequate room to form the wedge bond. In other embodiments, the location of the ball bond and the wedge bond can be reversed, and indeed it is not necessary to use any particular form of bond.

Figure 3:
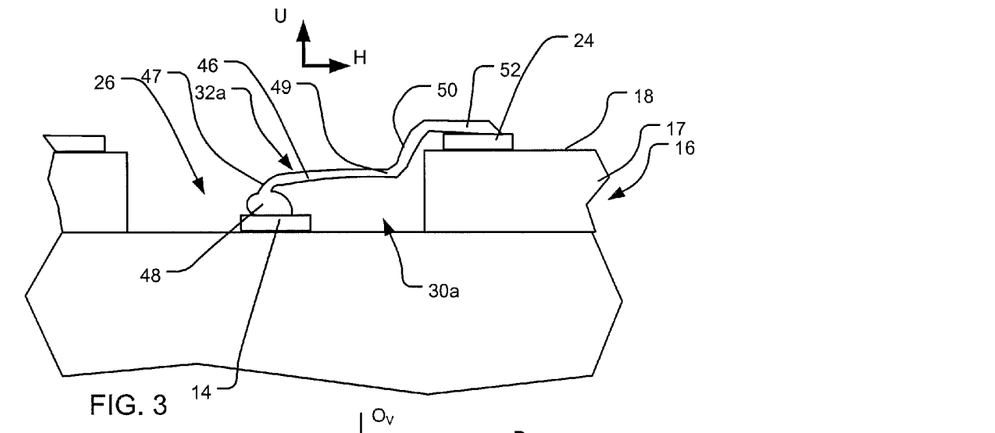
FIG. 3 is a further diagrammatic sectional view of the structure shown in FIG. 1.

As best seen in FIG. 3, a view similar to FIG. 2, each low lead 32a associated with a first pair 30a includes a main section 46 extending generally horizontally at a level below the vertical level of the second contact 24 incorporated in the pair 30a and desirably below the level of the top surface 18 of second element or substrate 16. The main section 46 is disposed within the slot 26 and extends from an end 47 adjacent first contact 14, where the main section joins a ball bond 48, to an end 49 remote from the first contact 14. The main section 46 joins a generally vertical leg 50 extending generally upwardly from the main section to the vicinity of the second contact 24. Leg 50 joins a short horizontal section 52, which is wedge-bonded to the second contact 24 of the pair.

Figure 4:
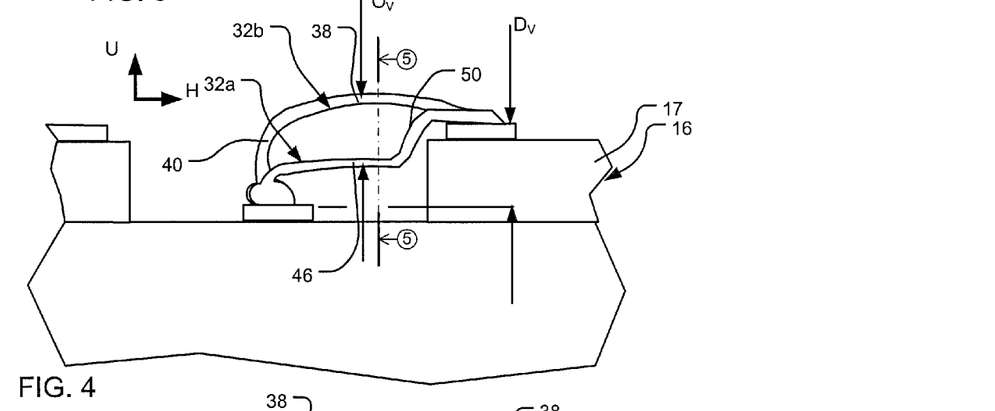
FIG. 4 is yet another diagrammatic sectional view of the structure shown in FIG. 1.

FIG. 4 is a view similar to FIGS. 2 and 3, where a high lead 32b and a low lead 32a are shown superimposed on one another, as they would be seen looking in the row direction. As shown in FIG. 4, the main section 38 of each high lead is offset from the main section 46 of each low lead in the upward or vertical direction. This offset is appreciable. Desirably, the average vertical offset $O_V$ between the centers of the wires main sections 38 and 46 is at least about 25% of the vertical distance $D_V$ between the contacts 14 of the first row and the contacts 24 of the second row. The offset distance $O_V$ between the main sections can be on the order of 50% or more of the row direction distance (FIG. 1) between each first pair 30a and the next adjacent second pair 30b. For example, where $D_V$ is about 200 microns, $O_V$ may be on the order of 170 microns. Preferably, the main sections of the high leads and low leads include at least about 25% of the length of each such lead and desirably at least about 40% or more of the length.

Figure 5:
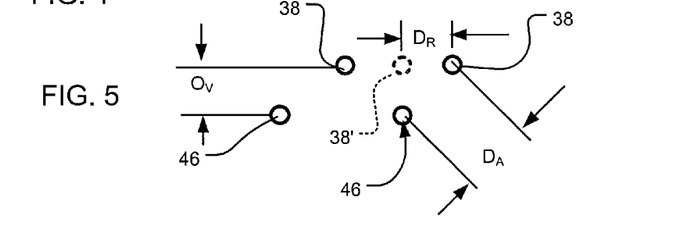
FIG. 5 is a diagrammatic sectional view taken along line 5-5 in FIG. 4.

FIG. 5 is a cross-sectional view taken along line 5-5 in FIG. 4. As best appreciated with reference to FIG. 4, the vertical offset $O_V$ substantially increases the spacing between the main sections. Thus, the actual distance $D_A$ between the main sections 38 and 46 of adjacent high and low leads is equal to the square root of $(D_R^2+O_V^2)$. By contrast, in a conventional wire-bonded structure having first and second contacts forming pairs at the same row direction distance $D_R$, but having all leads of the same configuration, the actual distance would be simply the row direction distance $D_R$. This is schematically shown in FIG. 5, where a hypothetical lead having a hypothetical main section 38' is shown in broken lines.

Moreover, as best seen in FIG. 4, the generally vertical legs 40 and 50 of the high and low leads are spaced apart from one another in the horizontal direction H. In a hypothetical structure having all high leads, the legs would be superposed on one another in the horizontal direction and thus spaced apart from one another only by the row distance $D_R$ (FIG. 5).

The increased spacing between adjacent high and low leads substantially reduces the mutual inductance between the high and low leads associated with adjacent first and second pairs. Desirably, the mutual inductance between the high and low leads of adjacent first and second pairs is less than about 90% of the mutual inductance which would be present between adjacent leads of a reference structure having an identical configuration of first and second row terminals and pairs, but having all of the leads formed as high leads so that there is no vertical offset between sections of mutually-adjacent leads. Stated another way, the differing configurations of the high and low leads are effective to reduce the mutual inductance between leads associated with adjacent contact pairs by at least about 10% of the mutual inductance present in the hypothetical reference structure. Desirably, the reduction is greater as, for example, about 20% or more and, in some cases, the differences in configuration between the high and low leads is sufficient to reduce the mutual inductance between leads of adjacent pairs by 30% or more of the mutual inductance which would be present in the reference structure absent the difference in configuration, i.e., with all high leads.

Structures as discussed above are particularly useful where the elements are arranged so that different currents, potential, or signals are conveyed through mutually adjacent first and second pairs. As discussed above, in the structure of FIGS. 1-5, the first element or semiconductor chip 10 desirably is arranged to send or receive different currents, potentials, or signals through the mutually adjacent pairs of the first and second row contacts. As mentioned above, the leads 30a and 30b of the first and second row contact pairs are interspersed with the leads 36 connecting contacts in the first row 14 with contacts of the third row 28. However, there is relatively little mutual inductance between leads 30a and 30b and leads 36, because leads 36 extend in the opposite horizontal direction from the first row contacts 14. The leads 36 of the first and third rows 14 and 28, can be arranged as discussed above, with reference to the leads connecting the first and second rows 14 and 24. Thus, alternating high and low leads can be provided between mutually adjacent pairs of first and third row contacts 14 and 28.

Figure 6:
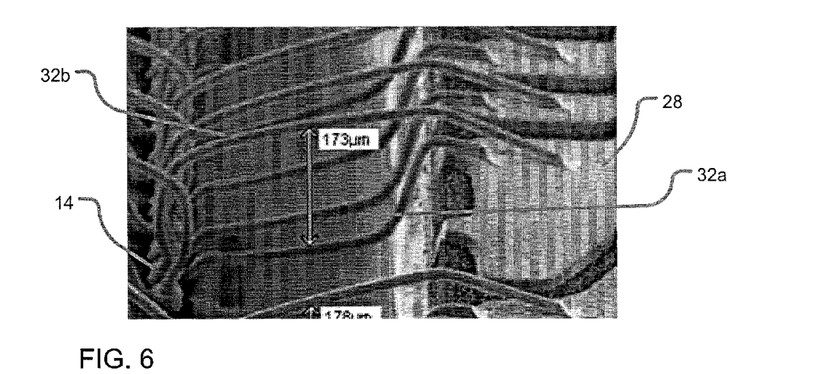
FIG. 6 is a photograph of a structure according to a further embodiment of the invention.

The configuration discussed above with alternating high and low leads need not be maintained over the entire length of the first and second rows. For example, the rows of first and second contacts may include some mutually adjacent pairs which are intended to carry the same potential, current or signals. This is commonly the case where multiple contacts are used to convey power or ground connections. In this instance, the mutual inductance between the leads associated with neighboring pairs is of relatively little concern, but the effective inductance between the contacts of each pair is important. To minimize the effective inductance, the pairs of contacts are configured as dual connection pairs. As depicted in FIG. 6. Each dual connection pair includes a contact 14 of the first row and a contact 28 of the second row. The contacts of each dual connection pair are interconnected with one another by two leads. Most preferably, the two leads include a high lead 32b and a low lead 32a, configured generally as discussed above. The high and low leads form a loop-like structure with widely spaced elements extending between the first row contact 14 and the second row contact 28 incorporated in the dual connection pair. Several dual connection pairs may be provided adjacent to one another. This arrangement is also schematically illustrated in FIG. 7, a sectional view similar to the sectional view of FIG. 5. The dual lead structure incorporating a high lead and a low lead provided substantially reduced effective inductance along the current path between the contact 14 and contact 28, incorporated in the dual connection pair.

Figures 7, 8, 9, 10:
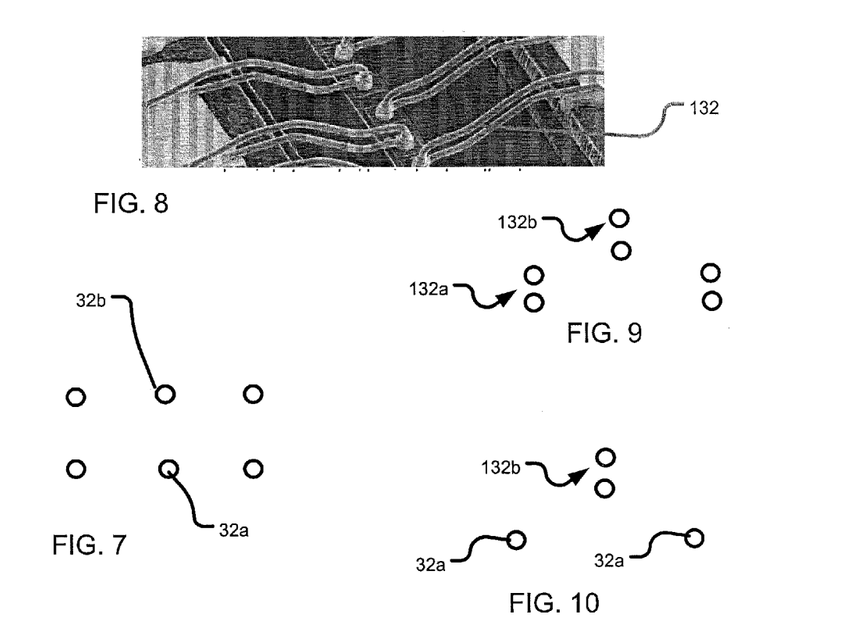
FIG. 7 is a diagrammatic sectional view depicting a portion of the structure shown in FIG. 6.
FIG. 8 is a photograph of a structure according to a further embodiment of the invention.
FIG. 9 is a diagrammatic sectional view depicting portions of the structure shown in FIG. 8.
FIG. 10 is a further fragmentary, diagrammatic sectional view similar to FIG. 9, but depicting a structure according to yet another embodiment of the invention.

In a further arrangement (FIG. 8), the individual leads, such as wire bonds discussed above, may be replaced by connectors incorporating two or more leads extending substantially parallel to one another and within about three lead diameters of one another. For example, where the leads are wire bonds having wire diameter of about 17 microns, a connector 132 (FIG. 8) may include two wires extending within about 50 microns center-to-center spacing of one another and extending substantially parallel to one another over at least the majority of their lengths. These connectors can be directly substituted for individual single leads. The connectors may be configured as high and low elements in exactly the same manner as the single lead connectors discussed above with reference to FIGS. 1-5. An arrangement of dual-lead conductive elements, including low elements 132a and high elements 132b is schematically shown in FIG. 9, a sectional view similar to the sectional view of FIG. 5 above. The arrangement depicted in FIG. 9 includes alternating high and low dual lead connectors 132a and 132b. This arrangement provides reduced mutual inductance between connectors associated with mutually adjacent pairs of contacts, and also provides somewhat lower effective inductance along the path between the contacts of each pair. Plural-lead conductive elements can be interspersed with single-lead conductive elements as used in FIGS. 1-5. Such an arrangement is schematically shown in FIG. 10, where a dual-lead conductive element is used as the high lead 132b, whereas single-lead conductive elements 32a are used as the low leads. The dual-lead and single-lead conductive elements in such an arrangement need not be provided in alternating sequence. However, the high-low alternating sequence should be maintained where reduced mutual inductance is desired.

In each of the embodiments discussed above, the leads are formed by wire bonds. However, in other variants, the leads may be formed as strips integral with elements such as the traces on the package substrate. Also, it is not essential that the contacts of the different rows be offset vertically from one another. The configuration of the leads can be varied from those depicted in FIGS. 1-10.

A structure according to a further embodiment (FIG. 11) includes a first element 210 such as a semiconductor chip having a first row of contacts 214 exposed at a surface of the element. Row 214 extends in a row direction R. The structure further includes a second element 216 having a second row of contacts 224 extending parallel to first row 214. Here again, the second row 224 is offset from the first row 214 in a horizontal direction H transverse to the row direction, and is also elevated above the first row in an upward direction U. Here again, the contacts are arranged in pairs, each such pair including one first-row contact 214 and one second-row contact 224. The pairs include first pairs having contacts 214a and 224a, and second pairs having contacts 214b and 224b. The first and second pairs are arranged in alternating sequence in the row direction. The contacts of each first pair are used to carry a first potential, such as a power potential Vss, whereas the contacts of each second pair are arranged to carry another potential such as a ground potential Vdd. For example, contacts 214a may be connected to the internal power supply connection of chip 210, whereas contacts 214b may be connected to the internal ground connection of the chip.

Figure 11:
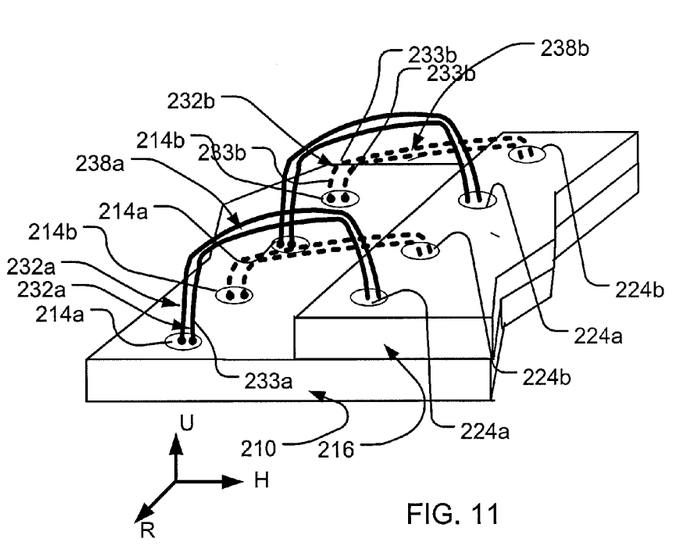
FIG. 11 is a diagrammatic perspective view depicting a structure according to yet another embodiment of the invention.

The structure according to this embodiment utilizes multi-conductor connectors. Each first pair has a high connector 232a extending between the first contact 214a of the pair and the second contact 224a of the pair. Each high connector 232a includes a pair of bond wires 233a extending generally parallel to one another and near one another. For example, the bond wires 233a constituting a single high connector may be spaced apart from one another by less than about three wire diameters, as, for example, about 50 µm center-to-center. Each second pair has a low connector 232b extending between the first contact 214b of the pair and the second contact 224b of the pair. Each low connector 232b includes a pair of bond wires 233b extending generally parallel to one another and near one another.

At least portions of the high connectors 232a are offset in the vertical direction from the low connectors 232b. For example, each high connector may include a main section 238a constituting a substantial portion of the length of the connector, and each low connector may include a similar main section 238b, the main sections being vertically offset from one another by a substantial offset distance $O_v$ as discussed above.

The multiple wires in each connector provide reduced self-inductance within the connector, whereas the offset distance between the high and low connectors combined with the alternating arrangement of high and low connectors provides reduced mutual inductance between adjacent connectors.

The particular connector shapes shown in FIG. 11 are merely one example. In another example (not shown) each bond wire 233a of a high connector 232a may have a shape similar to that of the high lead 32b discussed above with reference to FIG. 2. Each bond wire 233b of a low connector 232b may have a shape similar to that of the low lead 32a discussed above with reference to FIG. 3.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention.

The invention claimed is:

1. A microelectronic structure comprising:
  (a) a first element having a first row of contacts extending in a row direction in a first plane;
  (b) a second element having a second row of contacts extending parallel to the first row of contacts, the second row of contacts being offset from the first row in a horizontal direction transverse to the row direction and offset upwardly in the vertical direction from the first row of contacts, the first-row and second row contacts defining single-connection pairs each including a first-row contact and a second-row contact, the single-connection pairs including mutually adjacent first and second pairs arranged in alternating sequence in the row direction; and
  (c) elongated connectors, one of connectors extending between the first-row contact and the second-row contact of each of the single-connection pairs, the connectors associated with the first pairs being low connectors, the connectors associated with the second pairs being high connectors, each high connector extending generally upwardly from a first-row contact at a horizontal location adjacent the first row, each low connector extending generally horizontally from a first-row contact and extending generally upwardly at a horizontal location remote from the first row so that sections of the high connectors are offset vertically from sections of the low connectors.

2. A structure as claimed in claim 1 wherein the high and low connectors provide mutual inductance between neighboring high connectors and low connectors at least 10% lower than a reference value corresponding to the mutual inductance of neighboring connectors in an otherwise identical structure with no vertical offset.

3. A structure as claimed in claim 1 wherein each connector has a main section extending generally in a horizontal direction, and the main sections of the high connectors are offset vertically above the main sections of the low connectors.

4. A structure as claimed in claim 3 wherein each low connector includes a generally vertical leg extending upwardly from the main section of the low connector to a point adjacent the associated second-row contact, and wherein each high connector includes a generally vertical leg extending upwardly from a point adjacent the associated first-row contact to the main section of the high connector.

5. A structure as claimed in claim 3 wherein the main section of each low connector is disposed below the second row of contacts and the main section of each high connector is disposed at or above the second row of contacts.

6. A structure as claimed in claim 5 wherein a vertical offset between the main sections of the low connectors and high connectors is at least 25% of the vertical offset between the first and second rows of contacts.

7. A structure as claimed in claim 5 wherein the main section includes at least 25% of the length of each connector.

8. A structure as claimed in claim 5 wherein a vertical offset between the main sections of the low connectors and high connectors is at least about 50% of a distance in the row direction between the mutually adjacent first and second pairs.

9. A structure as claimed in claim 5 wherein a vertical offset between the main sections of the low connectors and high connectors is at least about 50 microns.

10. A structure as claimed in claim 1 wherein each connector is selected from the group consisting of single leads and plural leads extending substantially parallel to one another within about 3 lead diameters of one another.

11. A structure as claimed in claim 10 wherein the leads of the connectors are wire bonds.

12. A structure as claimed in claim 11 wherein at least one of the connectors is a single wire bond.

13. A structure as claimed in claim 11 wherein at least one of the connectors is a pair of wire bonds disposed one above the other.

14. A structure as claimed in claim 1 wherein the first and second rows of contacts are straight rows.

15. A structure as claimed in claim 1 wherein at least one of the elements is adapted to send or receive different currents, potential or signals through mutually-adjacent first and second pairs.

16. A structure as claimed in claim 1 wherein the first element is a semiconductor chip having the first contacts exposed at a front surface of the chip and the second element is a package substrate overlying the front surface of the chip.

17. A structure as claimed in claim 1 wherein the first and second rows of contacts each include one or more dual contacts, the dual contacts being arranged to provide at least one dual-connection pair, each including a dual contact of the first row and a dual contact of the second row, the structure further comprising two leads extending between the contacts of each dual-connection pair.

18. A structure as claimed in claim 17 wherein the two leads extending between the contacts of each dual-connection pair include an upper lead and a lower lead each lead having a midsection extending generally horizontally, the midsections of the upper leads being offset upwardly in the vertical direction from the midsections of the lower leads.

19. A structure as claimed in claim 18 wherein the dual contacts are arranged to provide a plurality of dual-connection pairs mutually adjacent to one another and wherein at least one of the elements is adapted to transmit or receive the same electrical current, potential or signal on the plurality of dual-connection pairs.

20. A microelectronic structure comprising:
   (a) a semiconductor chip having a first row of contacts exposed at a front surface of the chip extending in a row direction;
   (b) a package substrate overlying the front surface of the chip, the package substrate having an upwardly facing surface and a second row of contacts exposed at the upwardly facing surface extending parallel to the first row of contacts, the second row of contacts being spaced apart from the first row in a horizontal direction transverse to the row direction and is offset upwardly in the vertical direction from the first row of contacts, the first-row and second row contacts defining single-connection pairs each including a first-row contact and a second-row contact, the single-connection pairs including mutually adjacent first and second pairs arranged in alternating sequence in the row direction; and
   (c) elongated connectors extending between the first-row contact and the second-row contact of each of the single-connection pairs, the connectors associated with the first pairs being low connectors, the connectors associated with the second pairs being high connectors, the high connectors having at least about 30% of their length disposed above the second contacts, the low connectors having at least about 30% of their length disposed below the second contacts.

21. A structure as claimed in claim 20 wherein each high connector has a main section extending generally in a horizontal direction at an elevation above the surface of the substrate and each low connector includes a main section extending generally in a horizontal direction at an elevation below the surface of the substrate.

22. A structure as claimed in claim 21 wherein a vertical distance between the main section of each low connector and the front surface of the chip is less than about 50% of a vertical distance between the front surface of the chip and the surface of the substrate.

23. A structure as claimed in claim 21 wherein a vertical distance between the main section of each low connector and the front surface of the chip is less than about 25% of a vertical distance between the front surface of the chip and the surface of the substrate.

24. A structure as claimed in claim 21 wherein each high connector includes a generally vertical leg extending from the main section of the high connector to a point adjacent the associated first-row contact.

25. A structure as claimed in claim 24 wherein each low connector includes a generally vertical leg extending from a point adjacent the associated second-row contact to the main section of the low connector.

26. A structure as claimed in claim 20 wherein each connector is selected from the group consisting of single leads and plural leads extending substantially parallel to one another within about 3 lead diameters of one another.

27. A microelectronic structure comprising:
   (a) a semiconductor chip having a first row of contacts exposed at a front surface of the chip extending in a row direction;
   (b) a package substrate having a slot extending through it, the package substrate overlying the front surface of the chip so that the first contacts of the chip are disposed in alignment with the slot, the package substrate having an upwardly facing surface and a second row of contacts exposed at the upwardly facing surface extending parallel to the first row of contacts, the second row of contacts being spaced apart from the first row in a horizontal direction transverse to the row direction and offset upwardly in the vertical direction from the first row of contacts, the first-row and second row contacts defining single-connection pairs each including a first-row contact and a second-row contact, the single-connection pairs including mutually adjacent first and second pairs arranged in alternating sequence in the row direction; and
   (c) elongated connectors extending between the first-row contact and the second-row contact of each of the single-connection pairs, the connectors associated with the first pairs being low connectors, the connectors associated with the second pairs being high connectors, the high connectors being offset upwardly in the vertical direction from the low connectors over at least a portion of the lengths of the connectors, each of the high and low connectors including at least one wire bond, each of the wire bonds of the connectors having a ball bond at a first contact.

28. A structure as claimed in claim 27 wherein each wire bond has a wedge bond at a second contact.

29. A structure as claimed in claim 27 wherein each connector is selected from the group consisting of single wire bonds and plural wire bonds extending substantially parallel to one another within about 3 wire diameters of one another.

* * * * *